(12) United States Patent
Perrero et al.

(10) Patent No.: US 10,049,907 B2
(45) Date of Patent: Aug. 14, 2018

(54) AUTOMATED MODULE FOR ASSEMBLY LINES AND METHOD TO ACTUATE AND CONTROL THEREOF

(71) Applicant: BITRON SPA, Turin (IT)

(72) Inventors: Federico Perrero, Grugliasco (IT); Vincenzo Siciliano, Grugliasco (IT); Dario Bisson, San Francesco al Campo (IT); Alessandro Arnaboldi, Grugliasco (IT); Angelo Viola, Grugliasco (IT)

(73) Assignee: BITRON S.P.A., Turin (IT)

( * ) Notice: Subject to any disclaimer, the term of this patent is extended or adjusted under 35 U.S.C. 154(b) by 114 days.

(21) Appl. No.: 15/039,371

(22) PCT Filed: Nov. 21, 2014

(86) PCT No.: PCT/IB2014/066244
§ 371 (c)(1),
(2) Date: May 25, 2016

(87) PCT Pub. No.: WO2015/075685
PCT Pub. Date: May 28, 2015

(65) Prior Publication Data
US 2017/0092521 A1    Mar. 30, 2017

(30) Foreign Application Priority Data

Nov. 25, 2013    (IT) .............................. TO2013A0954

(51) Int. Cl.
*G06F 19/00*    (2018.01)
*H01L 21/67*    (2006.01)
(Continued)

(52) U.S. Cl.
CPC .... *H01L 21/67276* (2013.01); *H01L 21/4853* (2013.01); *H01L 21/67092* (2013.01);
(Continued)

(58) Field of Classification Search
CPC .......... H01L 21/4853; H01L 21/67092; H01L 21/67144; H01L 21/67276;
(Continued)

(56) References Cited

U.S. PATENT DOCUMENTS 5,777,873 A * 7/1998 Cox ................... G01R 31/2834
                                                                209/552
6,232,766 B1    5/2001 Saouli et al.
(Continued)

FOREIGN PATENT DOCUMENTS

WO        02/25301 A1    3/2002

OTHER PUBLICATIONS

International Search Report and Written Opinion from corresponding International Patent Application No. PCT/IB2014/066244, dated Mar. 10, 2015.
(Continued)

*Primary Examiner* — Kidest Bahta
(74) *Attorney, Agent, or Firm* — Merchant & Gould P.C.

(57) ABSTRACT

An automated module for assembly lines to assemble electronic devices includes a plurality of cells. Each cell includes a support structure, a control unit and at least one actuating system, operatively connected to the control unit for receiving commands and transmitting the results obtained as data to and from the control unit. The automated module includes at least one moving device, for moving at least one electronic device among the module's cells; and a supervision unit. The supervision unit interacts with each control unit of each cell, thus sending commands to control each single cell and receiving respective results from the respective control units as data; and to control the moving device for its activation, to move the electronic devices among the cells. The cells are independent and are assembled in a modular (Continued)

manner in the desired sequence, to perform a desired sequence of operations on the electronic device.

17 Claims, 11 Drawing Sheets

(51) Int. Cl.
*H01L 21/66* (2006.01)
*H01L 23/544* (2006.01)
*H01L 21/78* (2006.01)
*H01L 21/48* (2006.01)

(52) U.S. Cl.
CPC .. *H01L 21/67144* (2013.01); *H01L 21/67282* (2013.01); *H01L 21/78* (2013.01); *H01L 22/14* (2013.01); *H01L 23/544* (2013.01); *H01L 2223/54433* (2013.01)

(58) Field of Classification Search
CPC ............... H01L 21/67282; H01L 21/78; H01L 2223/54433; H01L 22/14; H01L 23/544; G06F 19/00; H05K 13/04; H05K 3/30; G01R 31/28; B23P 19/00
See application file for complete search history.

(56) References Cited

U.S. PATENT DOCUMENTS 6,876,192 B2 * 4/2005 Seppala ............. G01R 31/2806
324/537
2003/0179006 A1 * 9/2003 Seppala ............. G01R 31/2806
324/750.15

OTHER PUBLICATIONS

International Preliminary Report on Patentability from corresponding International Patent Application No. PCT/IB2014/066244, dated Oct. 29, 2015.

* cited by examiner

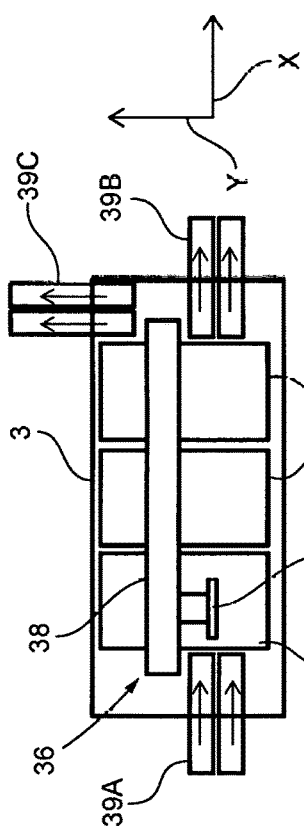
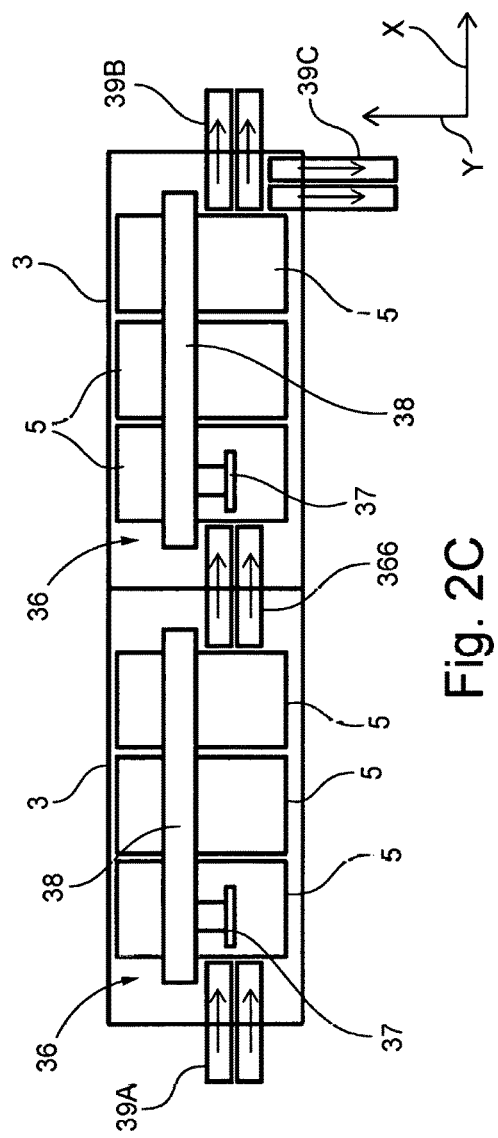
Fig. 2B
Fig. 2C

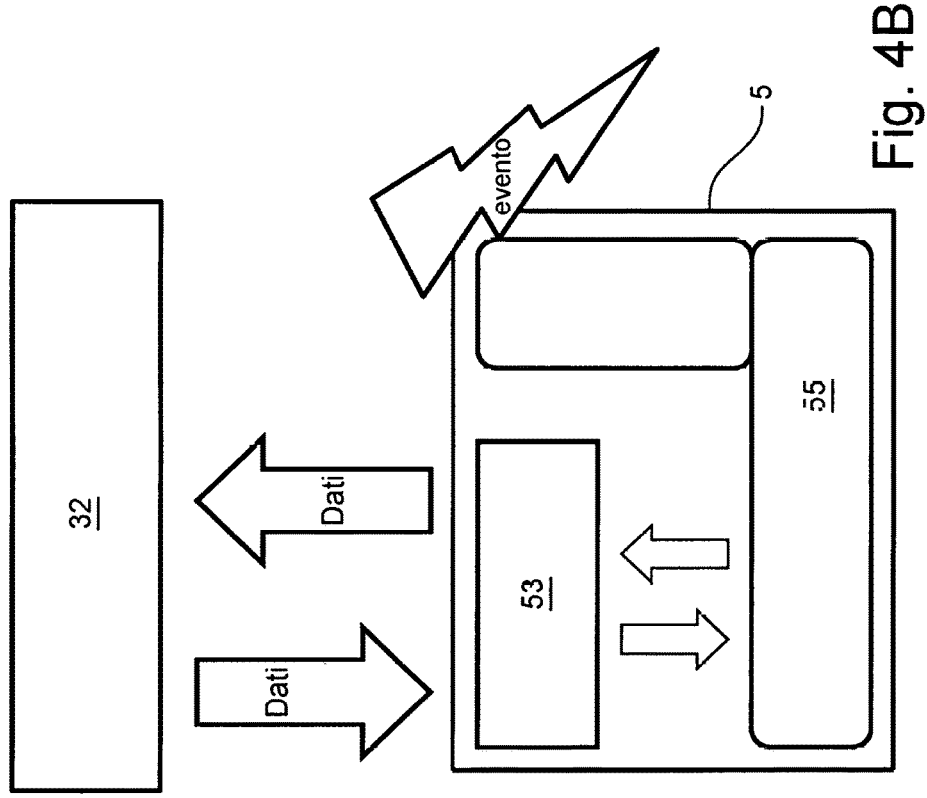

AUTOMATED MODULE FOR ASSEMBLY LINES AND METHOD TO ACTUATE AND CONTROL THEREOF

This application is a National Stage Application of International Application No. PCT/IB2014/066244, filed Nov. 21, 2014, which claims benefit of Serial No. TO2013A000954, filed Nov. 25, 2013 in Italy and which applications are incorporated herein by reference. To the extent appropriate, a claim of priority is made to each of the above disclosed applications.

BACKGROUND OF THE INVENTION

The present invention relates to a modular automated module for managing a plurality of cells, each of which, in turn, is suited to perform an operation on an electronic device. Said automated module is suited to be inserted into an assembly and/or testing line of an electronic device, comprising for example a PCB support of the PTH and/or SMD type. The present invention also relates to the method to actuate and control the automated module. The module according to the present invention is the final module of an assembly line to assemble electronic circuits.

Each module comprises a plurality of interchangeable and duly assemblable cells, wherein each cell can be associated with a specific actuation system, such as assembly systems, test systems and marking systems, which are interchangeable as a function of the cell to be provided and consequently of the module to be implemented.

Each module can be connected to one or more modules in a modular manner by providing series or parallel connections between said modules. Said connections allow the creation of a macro-module for performing certain operations, such as marking and/or assembling and/or testing operations, as a function of the electronic device coming from a manufacturing or assembly line.

The actuation method according to the present invention is the sequence of steps designed to fulfill the operating functions of each module cell, so as to determine whether the electronic device inserted into the module complies with the requirements. Said method allows the control and management of each single cell comprised in the module.

Assembly and test modules are known which, when positioned downstream of a line designed to wire and assemble an electronic device—normally of the SMD type, perform the functional and acceptance tests on the electronic devices manufactured by the line. Said cells can also be designed to perform, if necessary, the last assembly and marking steps on the electronic device.

Said modules are specifically designed for the testing or assembly of a certain electronic device. The stations or cells comprised in said modules are interdependent on one another, thus making the module stiff in terms of interchangeability of the actuation systems. Due to the impossibility to functionally change the single cells or stations, the module is exclusively suitable for the electronic device for which it was designed.

Said modules do not allow a quick functional change of the single station or cell because each station, and the module itself, are specifically manufactured to perform specific assembly or test functions on a specific electronic device.

No assembly and/or test modules for electronic devices are known which can be assembled with each other in a modular manner.

Furthermore, no modules comprising cells or stations are known which are connected to one another in a modular manner, wherein it is possible to change the sequence of stations or cells, and wherein the function of each cell or station can be changed by simply modifying the actuation system, for example the fixture associated therewith.

In the prior art, each specific module is controlled and managed by a data processing system which is suited to run the managing program of the predetermined module and is especially designed for the module itself. Said managing program is also normally used for the management of error signals.

In terms of software, due to said module management architecture, the module itself, and in particular the functions it can implement and the functions that can be implemented by the single stations or cells, are difficult to change.

No assembly and/or test modules are known which comprise a control unit having the ability to directly communicate with the single cell for the purpose of the correct operation of the module itself and also the ability to house new cells and/or remove cells and/or change a few functions of each cell or station, so as to adjust the module itself to other electronic devices than the ones for which it was originally designed.

The market is experiencing an increased demand for highly automated manufacturing or assembly lines which can assemble different electronic circuits, without for this reason disrupting the manufacturing or assembly line itself in order to allow the change of the electronic device to be assembled.

As already mentioned above, the most critical portion of the manufacturing or assembly line is the last module of the line, in particular the module designed to perform at least one test and the final marking of the electronic device. Making the module adjustable to different electronic devices is difficult because the final tests to be performed on the electronic device are highly specific for the single electronic device and are not easily generalizable to other electronic devices.

Furthermore, the market asks for the assembly line, and in particular the single modules, including the final test and marking module, to be highly flexible, to allow the single module and its functional features to be changed, and to be quick to assemble (both the cells and the module itself), so as to allow a rapid change of the functional features and immediately operationalize a module for a new electronic device. The same module is required to be able to handle different output standards.

The market also demands that the single module has a very high production speed, which is assessed by using the parameter called takt time, i.e. the ratio between an observation period of the assembly line and the number of compliant items produced by said line during the observation period.

This parameter is dependent: on the time required to move the electronic product among the different cells or stations comprised in a module; on the differences in the performance of the operations in the single cells, which may cause products to queue up in one or more cells or stations compared to others. Said parameter is, furthermore, a function of the possible faults of the single cells or stations of a module.

At present, no automated test and/or marking and/or assembly modules included in an assembly line are known which can be modified after having been manufactured, so as to adjust to performing other operations on an electronic device other than the ones for which the module was originally designed and assembled.

WO0225301 A1 discloses a testing system for automatic testing of circuit boards in a circuit board manufacturing line. The testing system comprises a set of test modules comprising a testing apparatus. Each test module comprises a horizontal module conveyor for conveying a circuit board into and out of the test module. The test modules are arranged in a superposed relation with respect to each other. The set contains test modules differing from each other so that the testing operations performed by these test modules are different from each other. A feed device has been fitted to receive circuit boards from the first line conveyor and to feed them into the test modules.

SUMMARY OF THE INVENTION

The object of the present invention is to solve the technical problems discussed above by providing an automated module for assembly lines and the actuation and control method associated therewith, thus allowing the solution of the above-mentioned technical problems.

An aspect of the present invention relates to an automated module.

A further aspect of the present invention relates to an assembly line.

A further aspect of the present invention relates to an actuation and control method.

BRIEF DESCRIPTION OF THE DRAWINGS

The features and advantages of the module, line and method according to the present invention will be best understood upon perusal of the following detailed description of different embodiments by way of example with reference to the following drawings, which respectively illustrate what follows:

FIGS. 2A, 2B, 2C and 2D show at least one module according to the present invention, in particular FIG. 2A shows an explanatory flowchart of a module comprising a plurality of cells; FIG. 2B shows a module comprising three cells; FIG. 2C shows two modules connected to each other in a modular manner, for example in a cascade connection, so as to obtain a macro-module; FIG. 2D shows, in a schematic manner, a module in a preferred embodiment;

FIG. 3A shows an embodiment of a generic module comprising three cells, FIG. 3B shows a generic explanatory cell which can be applied to a module, FIG. 3C shows a generic actuation system which can be applied to a cell that can be assembled with the desired module;

FIGS. 4A and 4B show, in a schematic manner, the management structure of at least one module in particular: the structure in FIG. 4A shows the conceptual scheme for controlling a generic module, for example a module in FIG. 2A; while FIG. 4B shows the management of a single, generic cell;

FIG. 5A shows an explanatory flowchart of an assembly line comprising a module according to the present invention; while FIG. 5B shows an explanatory flowchart of a possible actuation and control method for a module comprising a marking cell and two test cells;

FIG. 6A shows, in a schematic manner, a generic test cell, FIG. 6B shows, in a schematic manner, a generic assembly cell, while FIG. 6C shows, in a schematic manner, a generic marking cell.

DETAILED DESCRIPTION

With reference to the figures mentioned above, automated module 3 is suited to be associated with an assembly line 1 which, in turn, is suited to assemble electronic devices "P".

For the purpose of the present description, the term "electronic devices" "P" indicates any product comprising at least one electronic device, for example a device comprising at least one electronic board of the PCB type.

Figure 1:
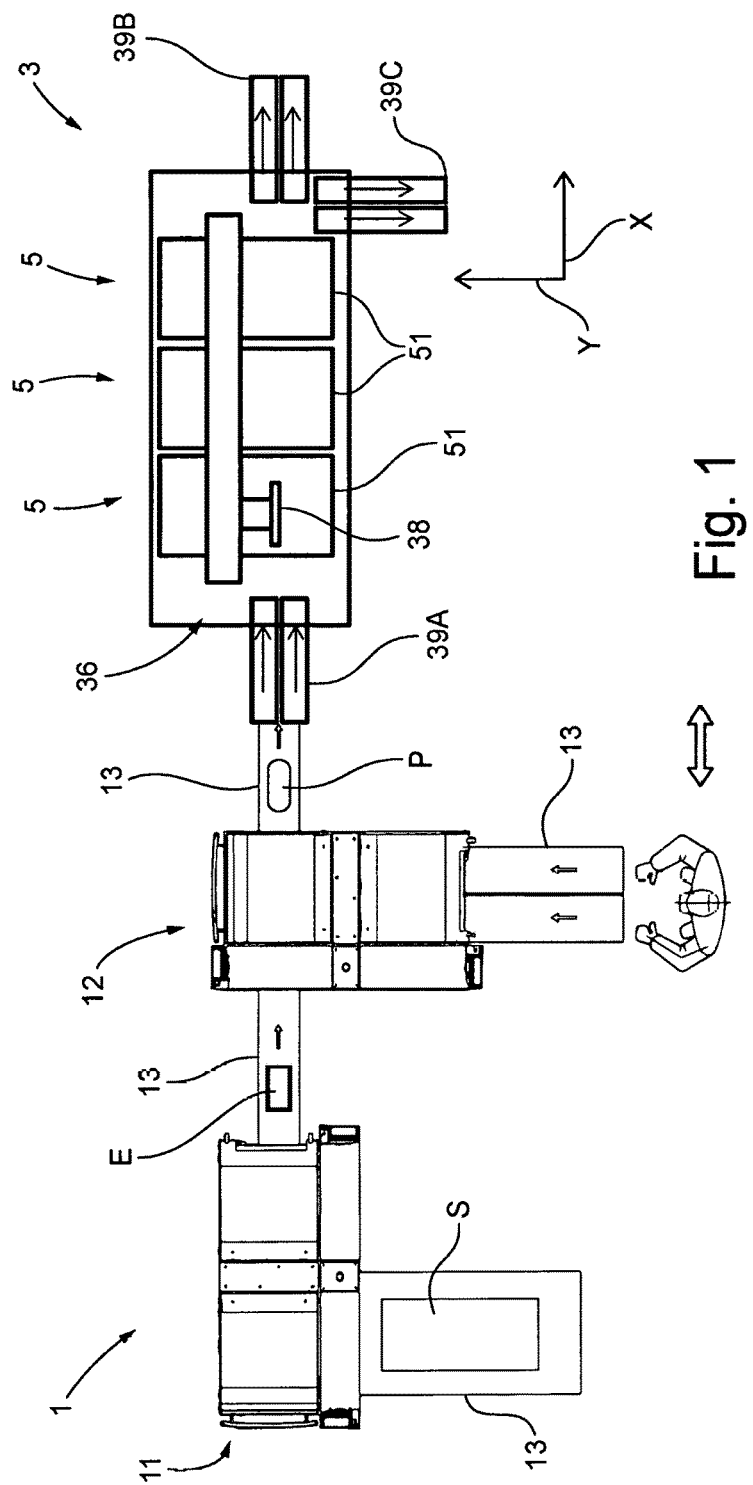
FIG. 1 shows a manufacturing or assembly line, wherein an automated module according to the present invention is provided.

Module 3 according to the present invention is preferably suited to be the last module of assembly line 1, as shown by way of example in FIG. 1. The same module 3 can be a conjunction module between assembly lines arranged in a cascade connection.

Figure 2A:
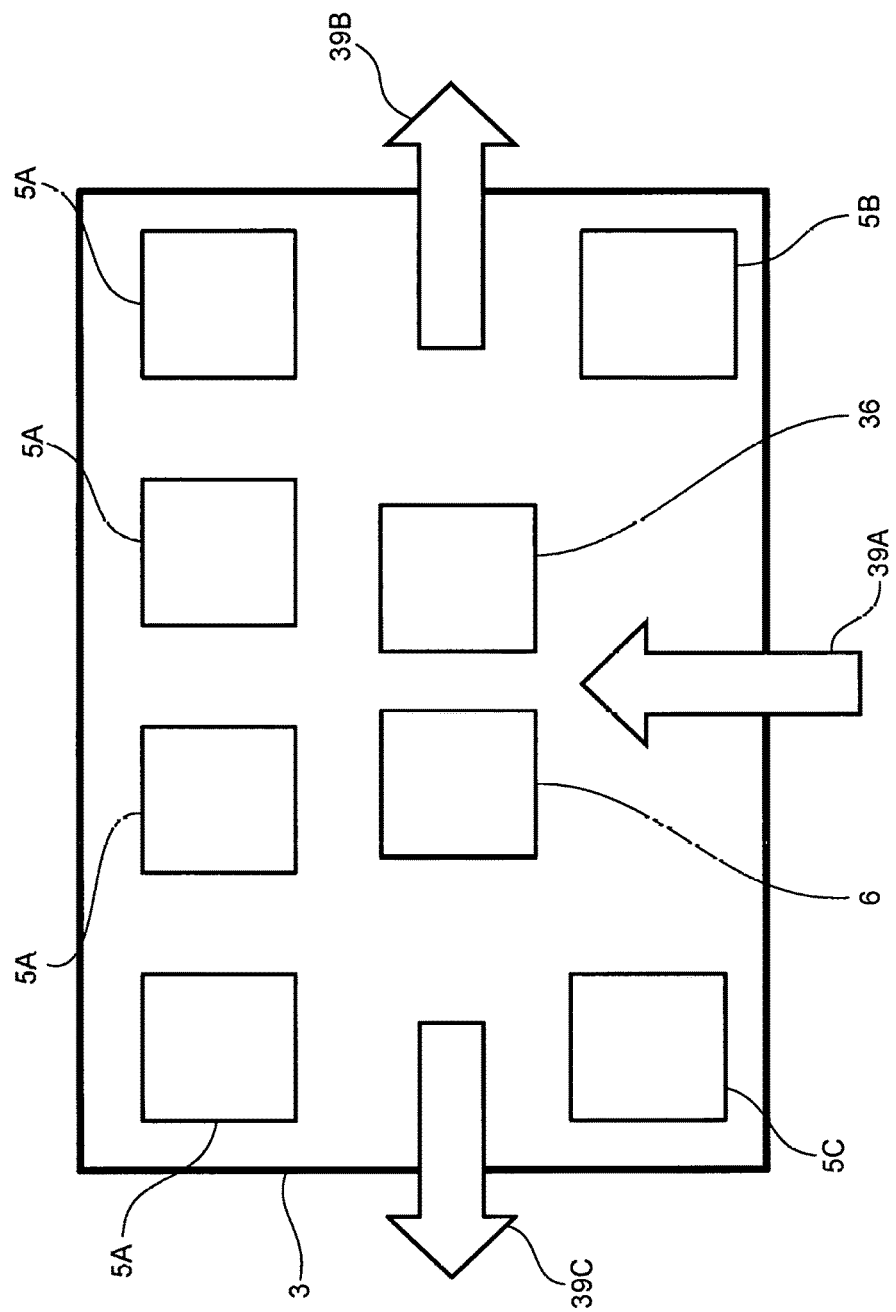

Automated module 3 comprises a plurality of cells (5, 5A, 5B, 5C), as shown by way of example in FIGS. 2A-2D. Each cell 5 comprises a support structure 51, a control unit 53 and at least one actuation system 55, as shown by way of example in FIG. 3A.

For the purpose of the present description, reference number "5" indicates a generic cell comprised in module 3 according to the present invention; on the other hand, reference numbers "5A", "5B" and "5C" indicate specific cells, which will be described more in detail for explanatory and non-limiting purposes in the description below.

Said actuation system 55 is operatively connected to said control unit 53 by means of communication lines (not shown in detail). Actuation system 55 is suited to receive commands at least from said control unit 53, and to transmit the results obtained, following its actuation, to said control unit 53 in the form of data.

Figure 3A:
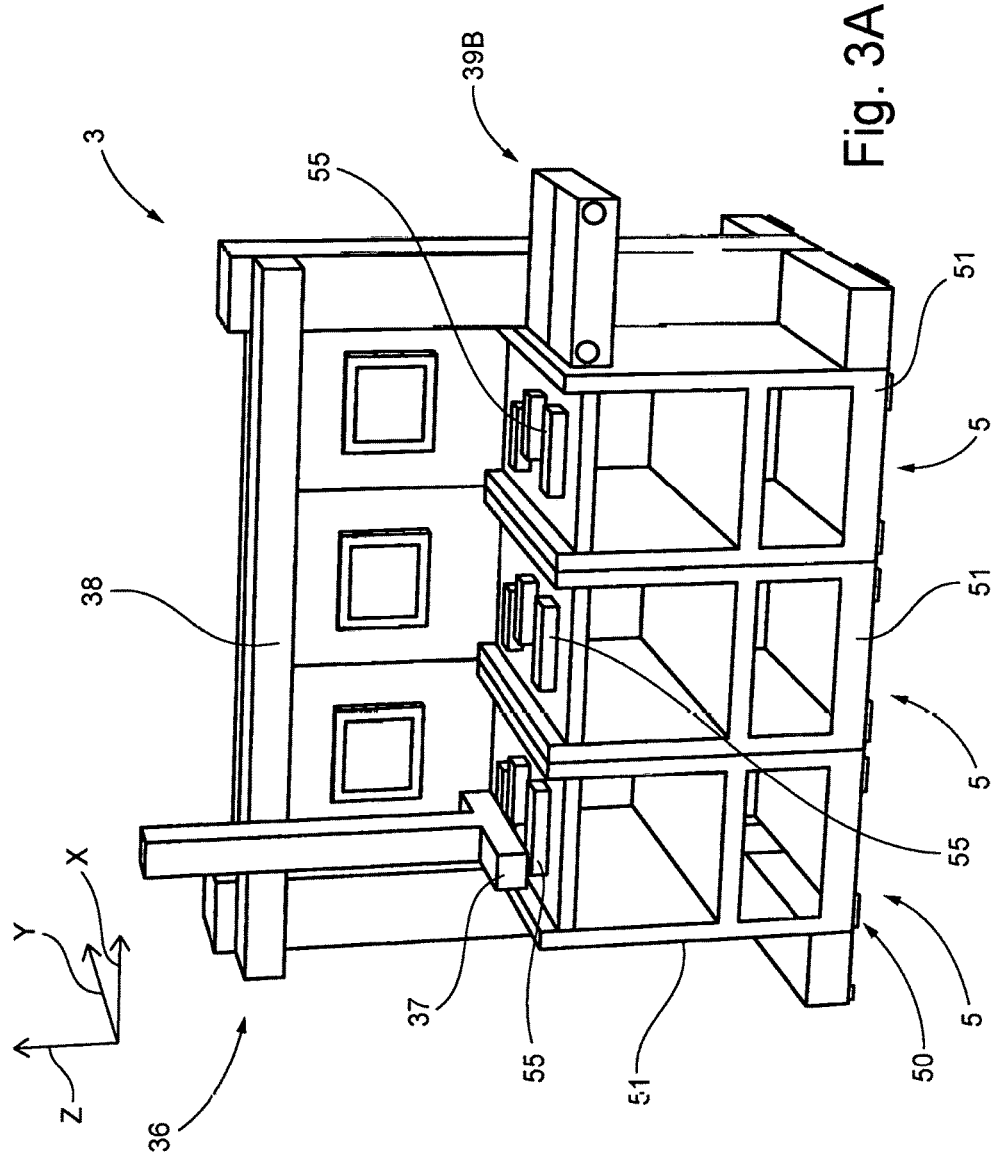
FIGS. 3A, 3B and 3C show more and more accurate details of a generic module, in particular
Figure 3C:
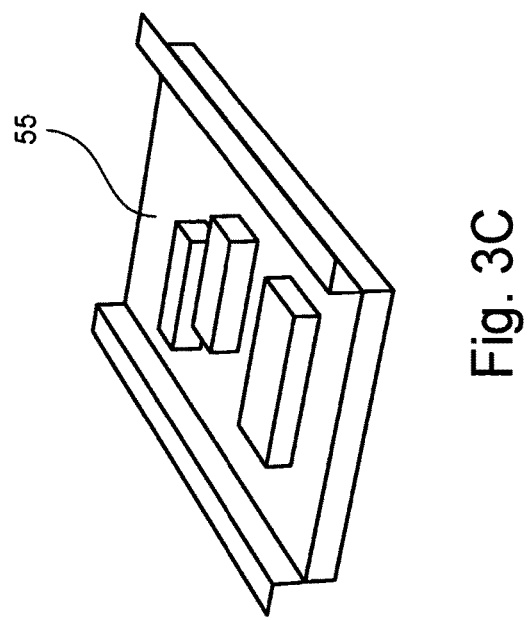
Figure 3B:
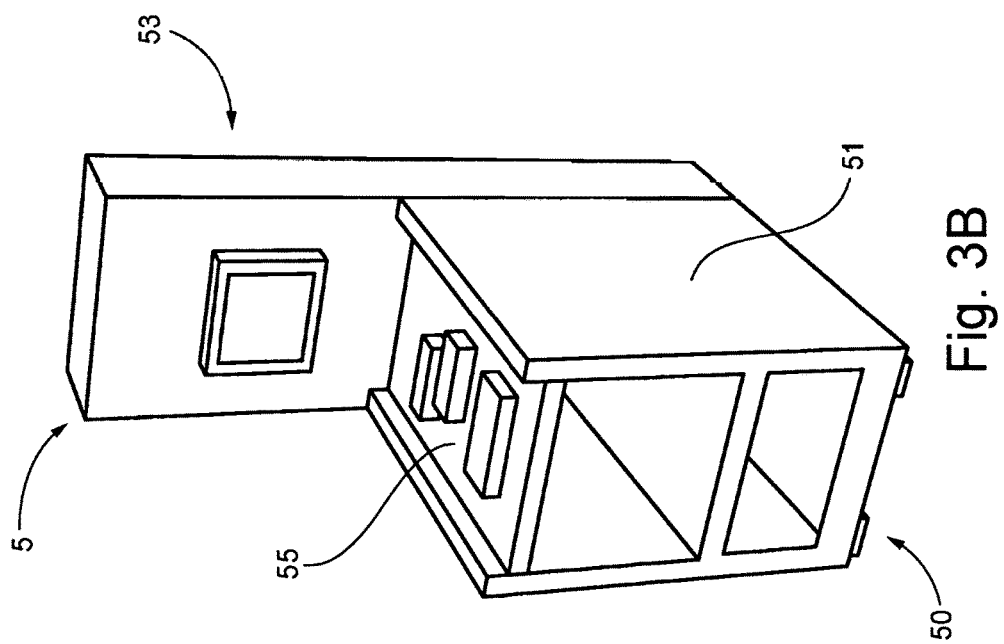

Said support structure 51 is the structure containing said control unit 53 and supporting said actuation system 55, as shown by way of example in FIG. 3B.

For every single cell 5, said actuation system 55 can comprise an instrument panel, electronic circuits, pneumatic circuits and instruments, not described in detail, which are necessary for the operations that can be performed by actuation system 55 itself, as a function of the operations for which system 55 was designed. Said components are preferably contained in support structure 51.

Said control unit 53 is suited to control and manage actuation system 55 and any components which may be necessary for the performance of the operations that can be performed by the respective actuation system 55.

Said control unit 53 interfaces with actuation system 55 by means of connectors, preferably universal ones, or adapters, so as to allow one or more actuation systems 55 to be connected and/or replaced from control unit 53 in an easy and quick manner.

Automated module 3 according to the present invention comprises at least one moving device 36, for moving at least one electronic device "P" among the different cells 5 comprised in module 3, as shown by way of example in FIGS. 1-3A.

Said at least one moving device 36 is manufactured so as to be able to move electronic devices "P" coming into automated module 3 among different cells 5 and, in the end, to lead the same electronic devices "P" towards an appropriate outlet, for example the electronic devices "P" which are deemed to be compliant are directed to a different outlet than the electronic devices which are deemed to be non-compliant.

For the purpose of the present invention, the term "compliant electronic device" indicates an electronic device "P" complying with all the manufacturing standards according to which it was designed. In particular, an electronic device "P" is deemed to be compliant if the results returned by the single cells 5 following the respective operations are all positive. On the other hand, the term "non-compliant electronic device" indicates an electronic device "P" for which at least one of the results returned by one of cells 5, following the respective operations, is negative.

Automated module 3, according to the present invention, comprises a supervision unit 32 for interacting with each control unit 53 of each cell 5, thus sending commands to control each single cell 5 and receiving the respective results from the respective control units 53 in the form of data.

Said supervision unit 32 is electrically connected to the single control units 53. Said supervision unit 32 interfaces with control units 53 by means of connectors, preferably universal ones, which are suited to allow one or more cells 5 to be added and/or removed in an easy and quick manner.

The same supervision unit 32 is also suited to control said at least one moving device 36 for its correct activation, so as to properly move electronic devices "P", for example coming into module 3, among the different cells 5 and towards the appropriate outlets.

The same supervision unit 32 comprises a computational unit for processing the results, in the form of data, received from the single cells 5, so as to at least determine whether the single electronic devices "P" are compliant or not.

In general, the different cells 5 comprised in automated module 3 are independent of one another and are assembled with one another in a modular manner in the desired sequence, so as to achieve the desired sequence of operations to be performed on electronic device "P".

For the purpose of the present description, the term "independent cells" indicates that the single cell is able to work in complete autonomy from the other cells comprised in the module. For this reason, the different cells 5 comprised in an automated module 3 according to the present invention can be assembled in a modular manner in the desired configuration, so as to perform a desired sequence of operations on electronic device "P".

Supervision unit 32 indexes the position of every single cell 5 comprised in module 3, so as to be able to properly activate moving device 36 to move electronic devices "P" within module 3 among the different cells 5. In general, the movement of electronic devices "P" within the module is a function of the actuation and control method implemented in module 3, in particular it is a function of the actuation sequence of the single operations, as described below. Furthermore, the movement of devices "P" can be chosen as a function of the queue of devices "P" waiting for a particular operation to be performed on them by a particular cell 5.

The above-mentioned technical features allow the user to obtain a versatile automated module, which can be modified in an easy and quick manner in order to change the sequence of operations to be performed on electronic device "P" according to the changes in the features of electronic device "P" to be tested.

Said technical features allow automated module 3 to be modified in an easy and quick manner as a function of electronic device "P" to be tested.

In general, automated module 3, according to the present invention, is manufactured in such a way that all the alarm circuits for the safety of module 3 itself are managed by means of dedicated and specific electronic circuits. In particular, said supervision unit 32 is independent of the alarm circuit management, i.e. supervision unit 32 is not included in the management of the alarm circuits comprised in automated module 3 according to the present invention. Said supervision unit 32 is only required to receive the notification of alarm events without acting on them.

Said supervision unit 32 is suited to manage the correct initialization sequence of the different cells 5. Preferably, the internal initialization of the single cell 5 can be managed internally by cell 5 itself by means of its control unit 53, which, in turn, communicates with supervision unit 32.

Figure 4A:
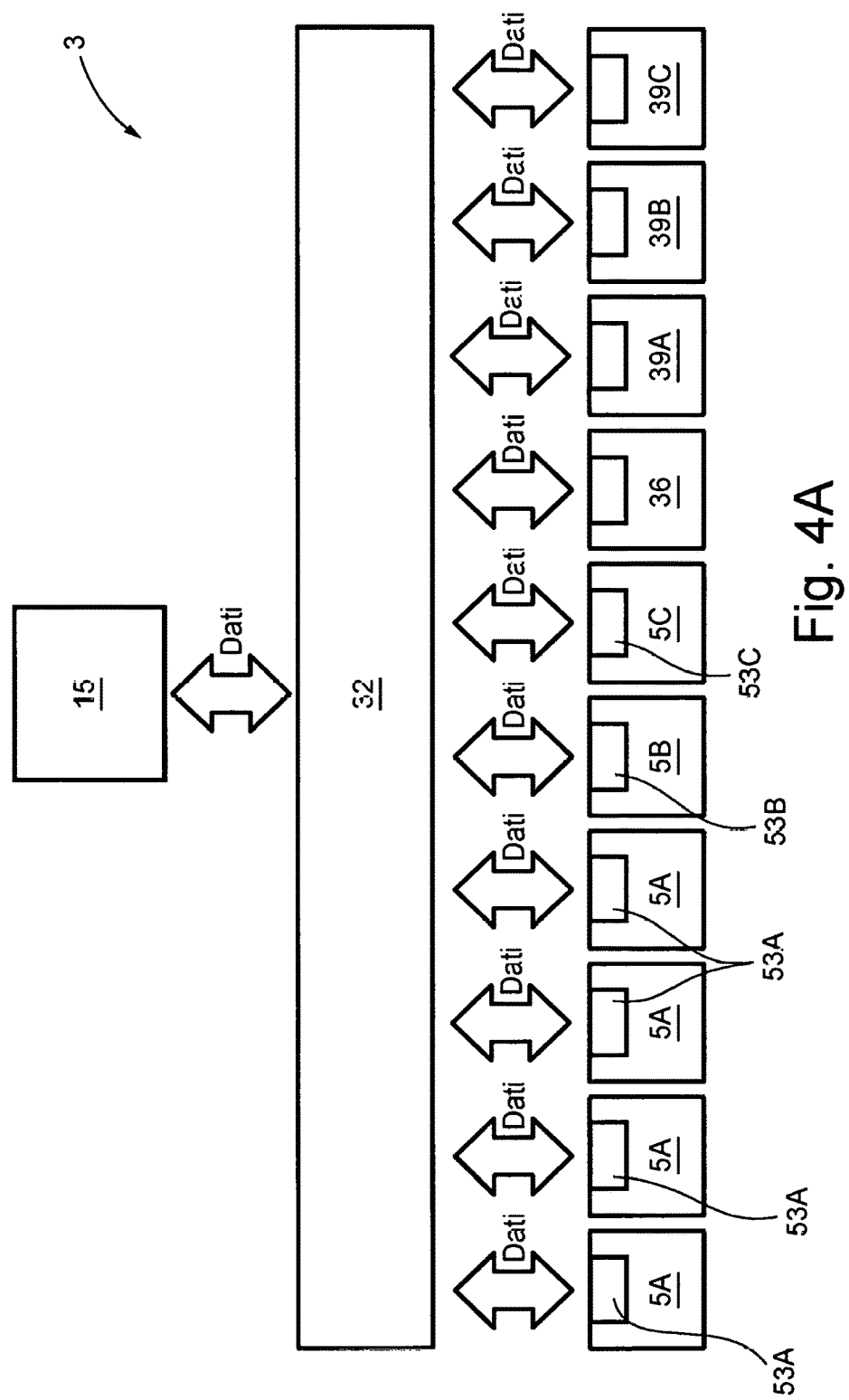

FIGS. 4A and 4B show, by way of example, the data flows from and to said supervision unit 32 relative to the different devices comprised in automated module 3 according to the present invention.

Automated module 3 according to the present invention comprises: at least one test cell 5A, for performing at least one functional test on at least one electronic device "P" by means of a respective actuation system, in particular a test system 55A. For the purposes of the present description, the expression "performing a functional test" means performing a test on electronic device "P", which can be of the electric and/or mechanic and/or visual and/or physical type, as a function of the technical features of electronic device "P" to be tested itself and of the test types the user intends to implement.

For the purposes of the present invention, the term "electrical test" indicates a test on the electronic device designed to test the electrical features of at least one element comprised in electronic device "P" to be tested. The test cell 5A can be, for example, a measurement device designed to acquire or measure an electrical parameter, for example voltage, or a reading station of the transponder type.

For the purposes of the present invention, the term "mechanical test" indicates a test on electronic device "P" designed to test the mechanical features of at least one element comprised in electronic device "P" to be tested. Test cell 5A can be, for example, a cell for testing the mechanical and/or leakage tightness of an outer casing; or it can be a cell for evaluating the packaging systems on electronic device "P" once it is finished.

For the purposes of the present invention, the term "visual test" indicates a test on electronic device "P" designed to check the arrangement, from a visual point of view, of at least one element comprised in electronic device "P" to be tested, or the presence of a particular distinctive element, such as a mark. Test cell 5A can be, for example, a reading cell or station of the barcode, matrix or RFID type.

For the purposes of the present invention, the term "physical test" indicates a test on electronic device "P" designed to test the physical features of at least one element comprised in electronic device "P" to be tested, for example, the features of a physical quantity generated by at least one element comprised in electronic device "P" to be tested. Test cell 5A can be, for example, a noise testing cell.

Automated module 3 according to the present invention comprises at least one marking cell 5C, for applying at least one distinctive sign onto at least one electronic device "P" by means of the respective actuation system 55, in particular a marking system 55C, suited, for example, to apply only one distinctive sign.

For the purposes of the present invention, the term "distinctive sign" indicates a sign suited to distinguish the single electronic device "P" reaching module 3, or a sign suited to distinguish the same type of electronic device "P", or to signal particular technical features in compliance with the relevant standards. Said sign can be an alphanumeric code and/or a distinctive symbolism. Marking cell 5C can be, for example, a marking cell of the laser, hot or painting type.

Module 3 according to the present invention comprises at least one inlet communication element 39A, such as a conveyor belt, suited to lead electronic device "P" inside module 3 itself, for example to allow at least one electronic device "P", coming from an assembly line 1, into module 3 itself. Said inlet communication element 39A is the incoming interface of module 3 and can be adjusted to the type of moving means used in assembly line 1 with which module 3 is associated.

Furthermore, a first outlet communication element 39B is provided, such as a conveyor belt, which is suited to lead electronic device "P", if it is deemed to be compliant, towards a following line, for example a packaging line. By means of said first outlet communication element 39B, an electronic device "P", if deemed to be compliant, can for example reach a first outlet, where devices "P" themselves can be properly packaged in order to be delivered to a user.

Furthermore, a second outlet communication element 39C is provided, such as a conveyor belt, which is suited to lead electronic device "P", if it is deemed to be non-compliant, towards a rejection line. By means of said second outlet communication element 39B, an electronic device "P", if deemed to be non-compliant, can reach a second outlet, where it is rejected.

Said outlet communication elements (39B, 39C) are the outgoing interfaces of module 3 and can be adjusted to the type of moving means used in the following lines, for example the packaging line and the rejection line.

Figure 2D:
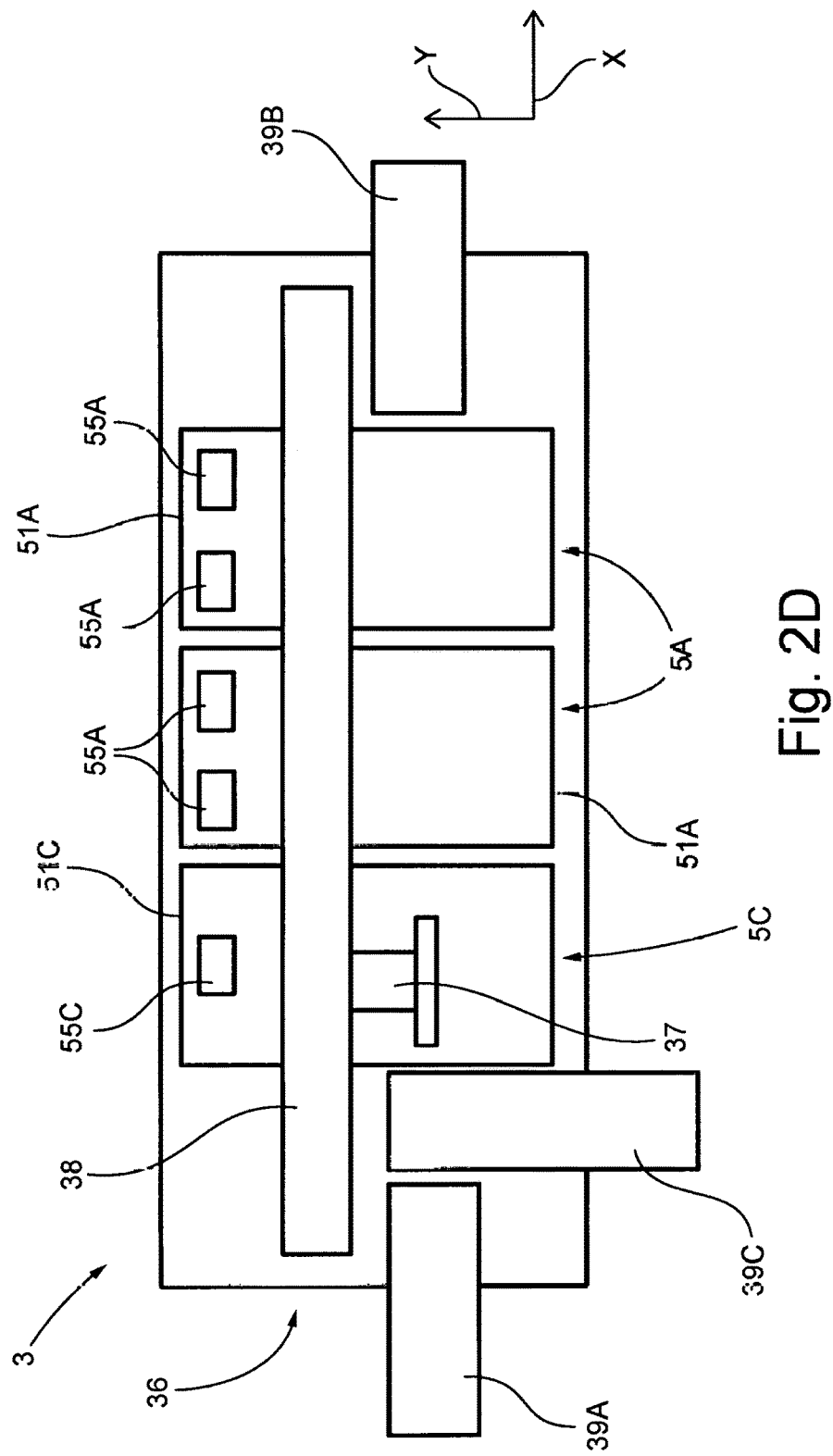

FIGS. 2B-2D show explanatory embodiments of module 3, where both the inlet communication element 39A and the outlet communication elements (39B and 39C) are visible.

In an explanatory but non-limiting embodiment, each cell 5 comprises at least one moving means 50, or a holding portion, such as an inlet for a lift truck, for example a transpallet meant for moving single cell 5, as shown by way of example in FIG. 3B. Said moving means 50 allows single cell 5 to be moved, so as to change the operative sequence to be performed on electronic device "P". Said moving means 50 can be a plurality of rollers or sliding blocks. Said moving means 50 allows each single cell 5 to be moved relative to the other cells 5 comprised in module 3, so as to change the order of the operative sequence to be performed on electronic device "P".

In general, module 3 according to the present invention also comprises at least one assembly cell 5B, for assembling at least one portion of at least one electronic device "P" by means of a respective actuation system, in particular an assembly system 55B.

For the purposes of the present invention, the term "assembling" indicates any operation performed on at least one part of electronic device "P", so as to allow the assembling and/or the union and/or the fixing of one or more portions or casings to electronic device "P". Assembly cell 5B can be a mounting cell or station and/or a welding cell or station, for example of the laser or ultrasound type. Assembly cell 5B can also be a rotation cell or station for electronic device "P", so as to properly position it for the subsequent cells 5. Furthermore, assembly cell 5B can be a fixing cell or station, such as a cell or station for applying a fixing means, for example glue, or a station designed to tighten fixing means like screws and/or bolts.

In an explanatory and non-limiting embodiment, said at least one moving device 36 comprises a holding element 37, for holding electronic device "P", and a moving structure 38 to allow the holding element 37 to be moved along at least two axes.

Said holding element 37 can be a clamp suited to get hold of said electronic devices "P", even if they have different sizes and shapes.

In the embodiment shown in FIGS. 2B-3A, said moving device 36 is an arm of the three-axis type, also known as XYZ arm, wherein said moving structure 38 is a structure equipped with two guides located above cells 5, a first guide along a first axis "X" and a second guide along a second axis "Y", by means of which said holding element 37 can slide. Said first axis "X" and said second axis "Y" are perpendicular to one another and define a plane "XY". Holding element 37 can also move along a third axis "Z", for example an axis which is vertical and perpendicular to said plane "XY", so as to allow the positioning of electronic device "P" in correspondence to actuation system 55 of each cell 5. In the embodiment of FIG. 2A, said moving device 36 can move in space in order to enable the holding element to reach all the cells (5A-5C), for example said moving structure is a robotic arm.

In general, in said automated module 3, the different cells (5, 5A-5C) are preferably arranged along a common axis, thus making up a line, for example along the direction of said first axis "X", as shown by way of example in FIGS. 1, 2B-2D and 3A. Equivalent configurations of module 3 involve the arrangement of the different cells (5, 5A-5C) along two axes parallel to one another, as shown by way of example in FIG. 2A, wherein the cells (5A-5C) can be located on different axes and preferably, at least partially, facing one another.

Said supervision unit 32 is suited to interface with at least one data storing device 15, so as to both store the data that may have been obtained from the different control units 53 of the single cells 5 and to collect relevant command data, as a function of the different cells 5 and actuation systems 55 comprised in module 3, as shown by way of example in FIG. 4A.

Said one data storing device 15, for example a server comprising non-volatile memory media, is suited to be updated with the different operating functions and parameters for each cell 5 comprised in module 3, and to be modified as the module itself varies its functions, in order to adjust module 3 itself to a different electronic device "P".

Supervision unit 32 itself is suited to interface with one or more control units comprised in the manufacturing or assembly line 1 for the management and control of devices (11-13) comprised in assembly line 1.

In general, the single module 3 according to the present invention can be connected, in a modular manner, to other modules which are similar or equivalent to one another or are suited to perform other functions, so as to obtain a macro-module 3' which is able to perform complex functions and/or reduce the time required for performing the operations on an electronic device "P".

The embodiment of FIG. 2C shows a macro-module 3' in which two automated modules 3 are arranged in a cascade connection manner. In general, a macro-module 3' can comprise two or more automated modules 3, which are identical or similar or complementary to one another and arranged in a cascade connection manner.

In each macro-module 3', at least one auxiliary moving device 366, such as a conveyor belt or a robotic arm, is comprised between two adjacent automated modules 3. Said auxiliary moving device 366 is preferably made up of at least part of a first outlet communication element 39B of module 3 arranged upstream and at least part of inlet communication element 39A of module 3 arranged downstream relative to the forwarding direction of electronic device "P" in the different modules. Said auxiliary moving device 366 substantially connects the first outlet communication element 39B with inlet communication element 39A of two adjacent modules.

In the explanatory embodiment shown in FIGS. 2A and 2D, each module 3 comprises at least two test cells 5A. Said at least two test cells 5A can perform the same functional test or functional tests that are different from each other.

In an explanatory embodiment, said at least two test cells 5A are operatively arranged in parallel to one another, so as to simultaneously test each an electronic device "P".

In an explanatory embodiment, said at least two test cells 5A are operatively arranged in series to one another, so as to test the same electronic device "P" in two different moments in time, one after the other.

In an explanatory embodiment, module 3 can comprise an identification device 6, for example an RFID system. Preferably, said identification device 6 is arranged close to inlet communication element 39A, so as to perform the identification of electronic device "P" as soon as it reaches module 3, as shown by way of example in FIG. 2A. Said identification device 6, in an alternative embodiment, corresponds to an actuation system 55 of a cell 5.

As shown in FIG. 4A, said supervision unit 32 is also suited to control identification device 6, inlet communication element 39A and said first outlet communication element 39B and second outlet communication element 39C.

Figure 6C:
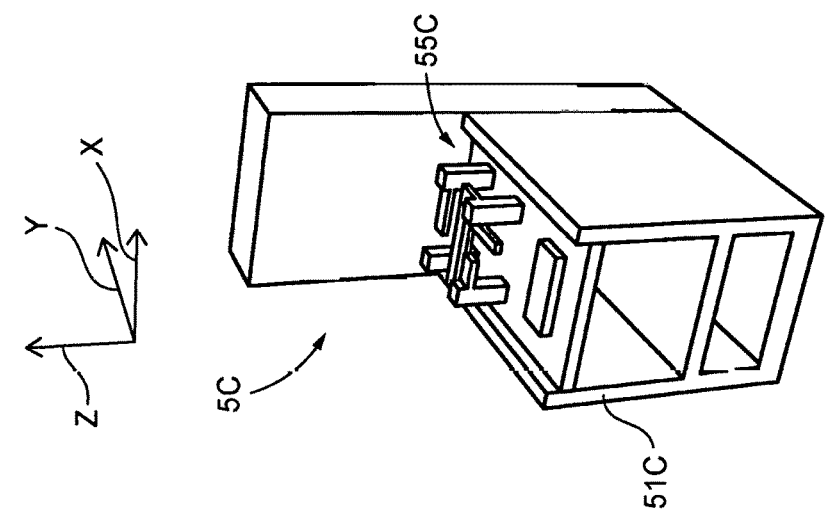
FIGS. 6A, 6B and 6C show, by way of simplifying, the different types of cells that can be implemented in a module according to the present invention, in particular
Figure 6B:
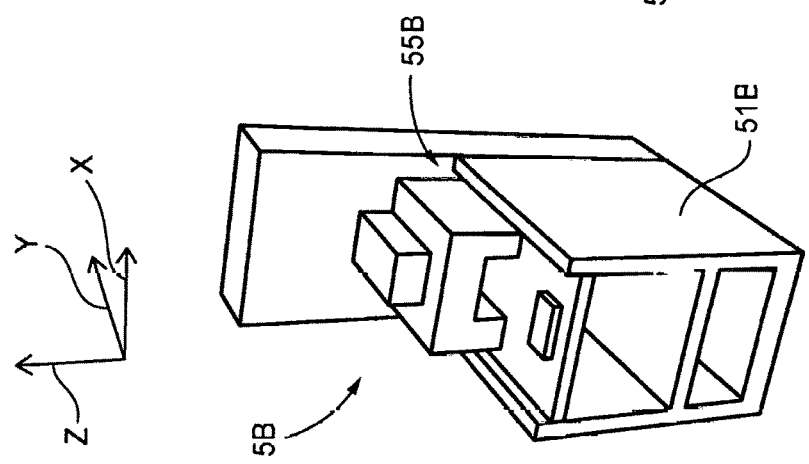
Figure 6A:
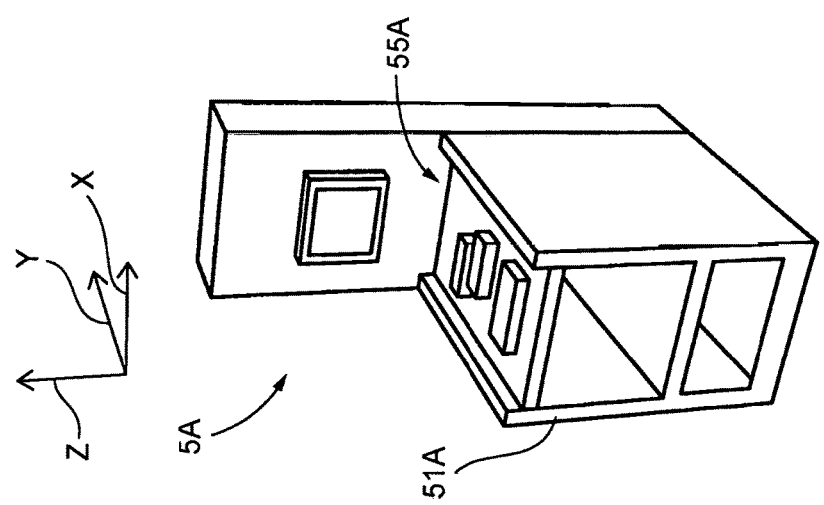

Moving on to the manufacturing details of each single cell 5, as shown in FIG. 6A, each test cell 5A comprises: an outer casing 51A, a test cell control unit 53A and at least two test systems 55A, each of which is operatively connected to said control unit 53A.

In general, each test system 55A is interchangeable, for example with a test system 55A suited to perform a different type of test, so as to modify the test parameters of cell 5A itself. The modification of the functional test parameters of test cell 5A is a function of the features of electronic device "P" to be tested. Said technical feature of test cell 5A makes the test cell 5A versatile, since the modification of test system 55A does not require any change to control unit 53A of cell 5A, at least in terms of hardware, nor to outer casing 51A.

In a first embodiment, which is not shown in detail, said at least two test systems 55A are operatively arranged in parallel so as to simultaneously test two electronic devices "P". In an equivalent embodiment, said at least two test systems 55A are operatively arranged in series so as to perform two functional tests on the same electronic device "P", for example two functional tests of different types. In principle, at least from a functional point of view, test systems 55A are similar to the test systems known to a person skilled in the art. The interface between the single test system 55A and control unit 53A and with supervision unit 32 is what distinguishes test cell 5A according to the present invention, and consequently automated module 3, from the modules and cells of the prior art.

Moving on to the manufacturing details, as shown in FIG. 6C, each marking cell 5C comprises: an outer casing 51C; a marking cell control unit 53C and a marking system 55C, which is operatively connected to said control unit 53C.

In general, each marking system 55C is interchangeable, for example with a marking system 55C suited to perform a different type of marking, so as to modify the marking function of cell 5C itself. The modification of the marking functions of marking cell 5C is a function of the features of electronic device "P" to be marked or of the desired marking type.

Said feature of marking cell 5C makes the marking cell 5C itself versatile, since the modification of marking system 55C does not require any change to control unit 53C of cell 5C, at least in terms of hardware, nor to outer casing 51C.

In general, said marking cell 5C can be able to implement a laser marking on the finished electronic device "P".

In general, a test cell 5A can be suited to control the marking performed by marking cell 5C.

Moving on to the manufacturing details, as shown in FIG. 6B, each assembly cell 5B comprises: an outer casing 51B; an assembly cell control unit 53B and an assembly system 55B, which is operatively connected to said control unit 53B.

In general, each assembly system 55B is interchangeable, for example with an assembly system 55B suited to perform a different assembly function, so as to modify the assembly function of cell 5B itself.

The modification of the assembly functions of assembly cell 5B is a function of the features of electronic device "P" to be assembled.

Said technical feature makes the assembly cell 5B versatile, since the modification of assembly system 55B does not require any change to control unit 53B of cell 5B, at least in terms of hardware, nor to outer casing 51B.

In principle, at least from a functional point of view, marking systems 55C and assembly systems 55B are similar to the respective marking and assembly systems known to a person skilled in the art. The interface between the single system (55B, 55C) and the respective control unit (53B, 53C) and with supervision unit 32 is what distinguishes the cells (5B, 5C) according to the present invention, and consequently automated module 3, from the modules and cells of the prior art.

In general, each module 3 comprises an outer casing comprising moving elements, for instance rollers or sliding blocks, or a holding portion, such as an inlet for a lift truck, for example a transpallet. Said moving element or holding portion can allow the whole module 3 to be moved, apart from the previously described possibility of moving the single cell 5. The casing itself can make up at least part of the support structure of moving device 36, in particular of the moving structure.

Assembly line 1, suited to comprise a module 3 according to the present invention, normally comprises at least one cutting module 11 for cutting a PCB circuit structure "S" in a plurality of electronic boards "E"; at least one assembly module 12 to assemble electronic components on each electronic board "E"; and at least one moving element 13 to move electronic boards "E" and PCB circuit structure "S" among the different modules of line 1.

The modules (11, 13) which are normally comprised in assembly line 1 will not be described in detail, since they are known to a person skilled in the art.

Figure 5A:
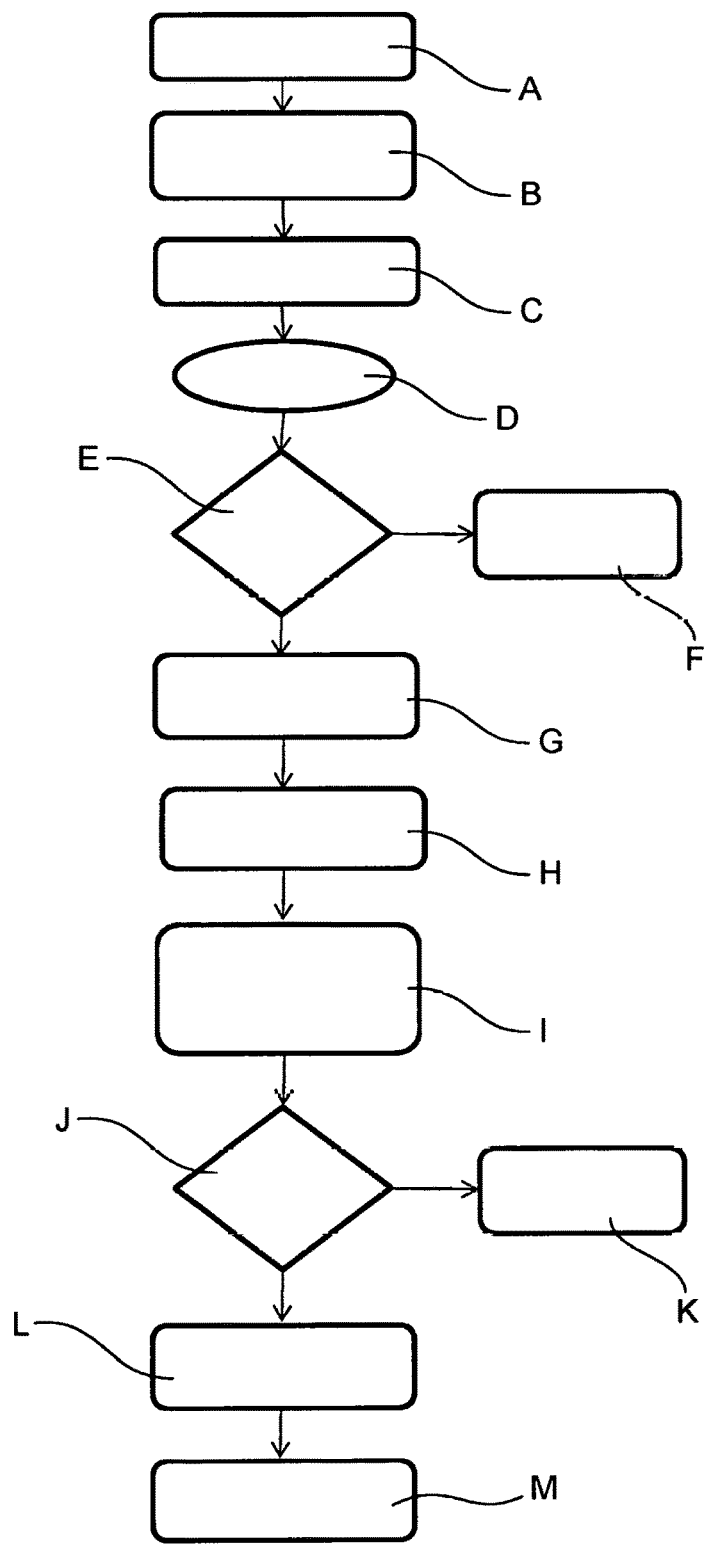
FIGS. 5A and 5B show explanatory flowcharts, in particular

FIG. 5A shows an explanatory flowchart with the steps of an assembly line 1, wherein a module 3 according to the embodiment in FIG. 1 is comprised.

Said flowchart shown in FIG. 5A includes, by way of example, the following consecutive steps:

A. loading a PCB circuit structure "S"
B. inserting said structure "S" into cutting module 11;
C. cutting said structure in a plurality of electronic boards "E";

D. recognition check of each electronic board "E";

E. processing the results, in the form of data, of the check performed in the previous step D.

F. if an electronic board "E" is not recognized, directing the board towards a rejection outlet;

G. if an electronic board "E" is recognized, directing board "E" towards a moving element 13;

H. transferring electronic boards "E" arranged on said moving element 13 towards assembly module 12;

I. performing the assembly of the electronic components and of any protection structures on electronic board "E", so as to obtain electronic device "P";

J. performing at least one test on electronic device "P" and processing the results obtained in the form of data;

K. if the test on electronic device "P" has a negative result, signaling an error;

L. if the test on electronic device "P" has a positive result, directing electronic device "P" towards automated module 3, according to the present invention.

Below you can find a detailed description of the essential steps of the actuation and control method of an automated module 3 used for checking the compliance of electronic devices "P".

Said method is particularly suited to be implemented by a computer residing, for example, in supervision unit 32 comprised in automated module 3, as previously described.

The method according to the present invention comprises the following steps:

picking up an electronic device "P", coming for example from line 1, from inlet communication element 39A and taking it to a cell 5 of automated module 3;

performing at last one first processing step, for example a marking step, on electronic device "P", by means, for example, of a marking cell 5C;

performing at least one moving step so as to move electronic device "P" between two cells 5 of module 3;

performing at last one second processing step, for example a test step, on electronic device "P", by means, for example, of a test cell 5A;

checking whether product "P" is compliant, for example by processing, by means of supervision unit 32, the results, in the form of data, coming from cells 5;

if device "P" is deemed to be compliant, moving electronic device "P" up to a first outlet communication element 39B;

if device "P" is deemed to be non-compliant, moving electronic device "P" up to a second outlet communication element 39C.

In general, the steps corresponding to a processing phases can increase, compared to the proposed number, as a function of the number of cells 5 comprised in each module 3 according to the present invention.

In general, at least one between said first processing step and said second processing step is performing at least one test step on electronic device "P". Furthermore, one of said processing steps is preferably performing at least one marking step on electronic device "P".

The method according to the present invention is implemented in a cyclic manner, preferably in a continuous cycle, substantially infinite, preferably until there are no more electronic devices "P" coming from assembly line 1.

The method according to the present invention preferably comprises at least one step of performing at least one assembly step to assemble a portion of electronic device "P", for example by means of at least one assembly cell 5B.

Said step of performing at least one assembly step can be considered as a previously mentioned processing step. In an alternative embodiment, one between said first processing step and said second processing step can be an assembly step.

The above-mentioned test step consists in the execution of a functional test, such as for example an electric test and/or a mechanical test and/or a visual test and/or a physical test, on electronic device "P". Said test step is implemented as a function of the type of functional test to be performed by means of test cell 5A on electronic device "P" to be tested.

The above-mentioned marking step consists in impressing or applying at least one distinctive sign on electronic device "P". Said marking step is implemented as a function of the type of marking to be performed by means of marking cell 5B on electronic device "P" to be marked.

The method according to the present invention can comprise a step for the recognition of electronic device "P", for example included in module 3 according to the present invention. Said step can be performed by means of said identification device 6 or be means of a specific test cell 5A, comprising for example a test system 55A comprising, in turn, an RFID reader. The recognition step is preferably performed immediately after the step of picking up an electronic device "P" from inlet communication element 39A. The recognition step is preferably performed before the step of performing at last one first processing step on the electronic device.

The method according to the present invention involves a preliminary transition step, in which automated module 3 according to the present invention, after being activated and/or connected to an assembly or manufacturing line 1, performs a check on different cells 5 and on the devices (36, 6, 39A-39C) comprised therein. Preferably, in this step different cells 5 and moving device 36 are set in an initial configuration and are ready to carry out the steps of the above-mentioned method.

The above-mentioned step of checking whether electronic device "P" is compliant can be repeated more than once, for example it can be performed after each one of the above-mentioned steps, for instance following each step of performing one processing step, performed on electronic device "P" by a cell 5. Indeed, following the command sent by supervision unit 32 to control unit 53 of a cell 5, with a view to activating the corresponding actuation system 55, control unit 53 itself returns the results obtained by actuation system 55 to supervision unit 32 in the form of data. Supervision unit 32, based on the data received by cells 5, can infer that electronic device "P" is not compliant with the manufacturing specifications and therefore move electronic device "P" up to a second outlet communication element 39C. If, on the other hand, supervision unit 32 deems electronic device "P" to be compliant, it can continue carrying out the method, by performing the step of moving towards a different cell 5 or by moving electronic device "P" up to a first outlet communication element 39B.

The method of the present invention comprises secondary cycles or subroutines which are carried out when an event occurs, wherein a cell 5 of module 3 generates an event without a direct command having been sent by control unit 53 and/or by supervision unit 32. A schematic representation is for example shown in FIG. 4B.

The method according to the present invention will have the most suitable sequence of steps based on both the number of cells 5 comprised in module 3 and on the type of cells 5 comprised in module 3 and as a function of the forming of a queue of electronic devices "P" for each single cell 5, so as to minimize the time required by modifying, in a dynamic manner, the sequence of functional operations to be performed on the single electronic device "P" by means of module 3, according to the present invention.

Module 3 according to the present invention can be provided with the desired number of cells 5, connected to one another in a modular way, wherein every cell 5 can perform a processing step as a function of the chosen type of cell (5A-5C), so that the desired processing steps are performed on electronic device "P".

Figure 5B:
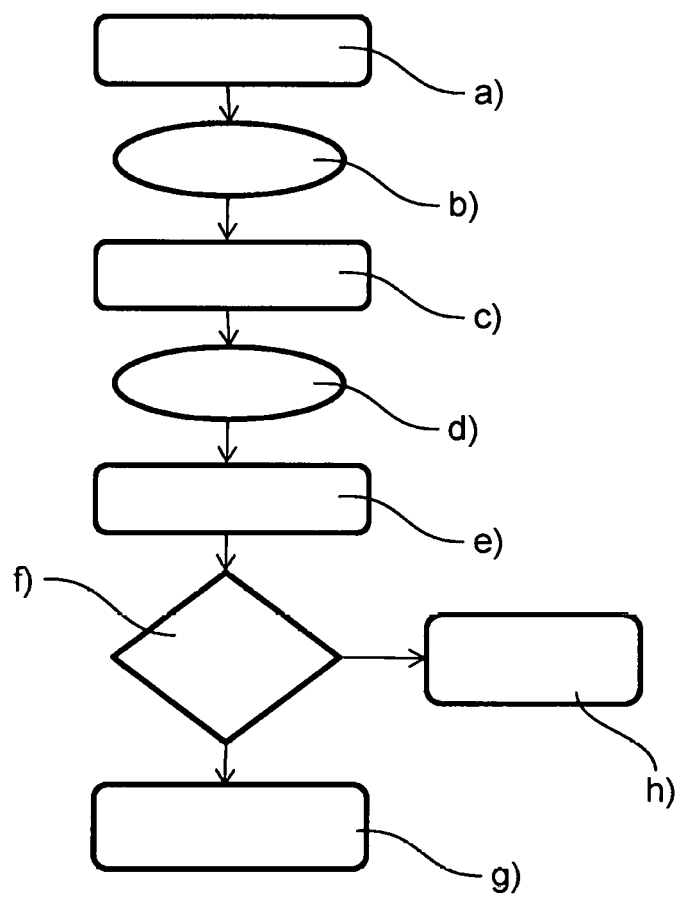

By way of explanatory and non-limiting example, the flowchart in FIG. 5B shows a sequence of steps that can be performed by a module 3 comprising, for example, only one marking cell 5C and two test cells 5A.

The figure shows the following sequence of steps:

a) picking up an electronic device "P", coming for example from line 1, from inlet communication element 39A and taking it to a cell 5 of automated module 3, by means of said moving device 36;

b) performing a step for the recognition of electronic device "P" which was picked up, for example, by means of an identification device 6;

c) performing a marking step on electronic device "P", for example by using marking system 55C of marking cell 5C;

d) performing a moving step so as to move electronic device "P", by means of said moving device 36, towards a test system 55A of a test cell 5A;

e) performing at least one test step on electronic device "P", by means of at least one test system 55A, for instance of the visual type, comprised in a test cell 5A;

f) checking whether electronic device "P" is compliant, for example by processing, by means of supervision unit 32, the data coming from control unit 53A of test cells 5A and from control unit 53C of marking cell 5C;

g) if device "P" is deemed to be compliant, moving electronic device "P" up to a first outlet communication element 39B;

h) if device "P" is deemed to be non-compliant, moving electronic device "P" up to a second outlet communication element 39C.

As mentioned above, the sequence of steps is performed by a module 3 preferably comprising one single marking cell 5C and two test cells 5A. Even more preferably, said two test cells 5A are substantially identical to each other and suited to perform the same test function. In particular, said two test cells 5A are suited to perform a visual test on electronic device "P". More in detail, each test cell 5A comprises two test systems 55A which are substantially identical to each other.

Thanks to the presence of two substantially similar test cells 5A, the test can be performed in a parallel way by simultaneously testing at least two electronic devices "P". More in detail, since two test systems 55A are comprised, each test cell 5A can simultaneously test two electronic devices "P".

In general, the peculiarity of module 3 according to the present invention is its versatility, which means it is not dedicated to a single product/process, on the contrary it can be easily configured by replacing the different cells 5 comprised therein or by simply replacing actuation systems or fixtures 55 belonging to each different cell 5.

Module 3 according to the present invention allows three degrees of freedom to be achieved in the desired embodiment of module 3 or macro-module 3', and in particular:

each module 3 can be connected to a similar or equivalent module in a cascade connection manner, thus obtaining a macro-module 3';

each module 3 can change the type of cells 5 comprised therein or their order, so as to obtain the desired sequence of functional operations;

each single cell 5 can be modified by changing only actuation system or fixture 55 associated therewith, by allowing the modification of the features of a specific cell 5 (test, assembly, marking) or the modification of the type itself of starting cell 5, or by changing the features of actuation system 55, without changing control unit 53 suited to manage the cell. By way of example, it is possible to both modify the type of functional test by modifying test system 55A, and to obtain an assembly cell 5B starting from a test cell 5A, by changing, for example, only actuation system 55.

Module 3 according to the present invention allows the distinction between electronic devices "P" to be deemed as compliant and electronic devices "P" to be deemed as non-compliant.

Module 3 according to the present invention can be equipped with a desired number of cells 5 by connecting the different cells 5 to each other in a modular way, so as to obtain the desired sequence. Therefore, module 3 according to the present invention turns out to be flexible thanks both to its modularity, which makes it possible to assemble the different cells (5A-5C) with other cells (5A-5C), and to the flexibility of the single cell 5, which can rapidly change its functional features as a function of the single electronic device "P" to be manufactured and/or tested, by modifying the relevant actuation system 55.

Module 3 according to the present invention can be reused for the manufacturing of different electronic devices "P".

By way of explanatory and non-limiting example, module 3, according to the present invention as shown in FIG. 2D, allows a production change of electronic device "P" to be performed in about an hour.

Module 3 according to the present invention is characterized by the independence of the single cells 5, i.e. each cell 5 can work in complete autonomy from the other cells 5.

Module 3 according to the present invention is able to restore itself on its own thanks to the presence of supervision unit 32, which can rapidly interface with the single control units 53 of the single cells 5. Each cell 5 is able to restore itself on its own thanks to the presence of control unit 53, which can rapidly interface with the different actuation systems 55 that can be associated with each single cell 5.

Possible embodiments of module 3 that are not shown in the drawings but can be deduced by a person skilled in the art should be considered as part of the scope of protection of the present invention.

NUMERICAL REFERENCES

Assembly line 1
Cutting module 11
Assembly module 12
Moving element 13
Data storing device 15
Automated module 3
Macro-module 3'
Supervision unit 32
Moving device 36
Auxiliary moving device 366
Holding element 37
Moving structure 38
Inlet communication element 39A
First outlet communication element 39B Second outlet communication element 39C
Cell 5
Moving means 50
Support structure 51
Control unit 53
Actuation system 55
Test cell 5A
Outer casing 51A
Test cell control unit 53A
Test system 55A
Assembly cell 5B
Outer casing 51B
Assembly cell control unit 53B
Assembly system 55B
Marking cell 5C
Outer casing 51C
Marking cell control unit 53C
Marking system 55C
Identification device 6
PCB circuit structure S
Electronic board E
Electronic devices P
First axis X
Second axis Y
Third axis Z

The invention claimed is:

1. An automated module for assembly lines to assemble electronic devices;
said automated module is adapted to be a last module of an assembly line to assemble electronic devices, and to perform at least one test and final marking of the electronic device;
said automated module comprises a plurality of cells;
each cell comprises:
a support structure;
a control unit;
at least one actuating system, operatively connected to said control unit, for receiving commands and for transmitting results obtained, in the form of data, from and to said control unit;
said automated module comprises:
at least one moving device, for moving at least one electronic device among the cells comprised in the module;
a supervision unit, for:
interacting with each control unit of each cell, thus sending commands to control each single cell and receiving the respective results from the respective control units in the form of data;
controlling said at least one moving device for its activation, so as to move the electronic devices among the different cells;
the different cells are independent of one another and are assembled with one another in a modular manner in a desired sequence, so as to perform a desired sequence of operations on the electronic device;
at least one test cell, for performing at least one functional test on at least one electronic device by a respective actuation system, and
at least one marking cell, for applying at least one distinctive sign onto at least one electronic device by a respective actuation system.

2. The module according to claim 1, wherein at least one assembly cell is provided, for assembling at least one portion of at least one electronic device by a respective actuation system.

3. The module according to claim 1, wherein each module comprises at least two test cells, which are operatively arranged in parallel to one another, so as to each simultaneously test an electronic device.

4. The module according to claim 1, wherein each test cell comprises:
an outer casing;
a test cell control unit;
at least two test systems, each of the test systems is operatively connected to said control unit;
each test system is interchangeable, so as to modify its test parameters as a function of features of the electronic device to be tested.

5. The module according to claim 4, wherein said at least two test systems are operatively arranged in parallel so as to simultaneously test two distinct electronic devices.

6. The module according to claim 4, wherein said at least two test systems are operatively arranged in series so as to perform two distinct functional tests on the same electronic device.

7. The module according to claim 1, wherein each marking cell comprises:
an outer casing;
a marking cell control unit;
a marking system, which is operatively connected to said control unit;
said marking system is interchangeable, so as to modify a marking functions as a function of the features of the electronic device to be marked.

8. The module according to claim 1, wherein said at least one moving device comprises a holding element, for holding the electronic device, and a moving structure to allow the holding element to be moved along at least two axes.

9. The module according to claim 2, wherein each assembly cell comprises:
an outer casing;
an assembly cell control unit;
an assembly system, which is operatively connected to said control unit;
said assembly system is interchangeable, so as to modify an assembly functions as a function of the features of the electronic device to be assembled.

10. The module according to claim 1, wherein each cell comprises at least one moving means to move the single cell.

11. An assembly line to assemble electronic devices comprising:
at least one cutting module to cut a PCB circuit structure in a plurality of electronic boards,
at least one assembly module to assemble electronic components on each electronic board,
at least one moving element to move said electronic boards and said PCB circuit structure among the different modules of the line,
at least one automated module according to claim 1.

12. An assembly line according to claim 11, wherein said module is arranged at an end of the assembly line.

13. A method to actuate and control an automated module to check compliance of electronic devices;
the method being implemented by an electronic processor residing in a supervision module comprised in the automated module according claim 1;
the method comprises the following steps:
picking up an electronic device from an inlet communication element and taking the electronic device to a cell comprised in the automated module;
performing at last one first processing step on the electronic device;

performing at least one moving step so as to move the electronic device between two cells of the module;

performing at least one second processing step on the electronic device;

checking whether the product is compliant by processing, by the supervision unit, the results, in the form of data, coming from the different cells;

if the device is deemed to be compliant, moving the electronic device up to a first outlet communication element;

if the device is deemed to be non-compliant, moving the electronic device up to a second outlet communication element.

14. The method according to claim 13, wherein at least one of said first processing step and said second processing step is performing at least one test step on the electronic device.

15. The method according to claim 14, wherein one of said processing steps is performing at least one marking step on the electronic device.

16. The method according to claim 14, wherein a step is provided to perform at least one assembly step to assemble a portion of the electronic device.

17. The method according to claim 14, wherein:

the test step comprises executing a functional test by executing an electric test and/or a mechanical test and/or a visual test and/or a physical test, on the electronic device; and the marking step comprises impressing at least one distinctive sign on the electronic device.

* * * * *